(12) United States Patent
Han et al.

(10) Patent No.: US 8,797,112 B2
(45) Date of Patent: Aug. 5, 2014

(54) MODULATOR, MIXER AND METHOD FOR AMPLITUDE SHIFT KEYING MODULATION

(75) Inventors: Peng Han, Shanghai (CN); Dawei Guo, Shanghai (CN); Jiazhou Liu, Shanghai (CN); Yanfeng Wang, Shanghai (CN)

(73) Assignee: Beken Corporation, Shanghai (CN)

( * ) Notice: Subject to any disclaimer, the term of this patent is extended or adjusted under 35 U.S.C. 154(b) by 282 days.

(21) Appl. No.: 13/400,129

(22) Filed: Feb. 20, 2012

(65) Prior Publication Data
US 2013/0162363 A1    Jun. 27, 2013

(30) Foreign Application Priority Data

Dec. 27, 2011  (CN) .......................... 2011 1 0445994

(51) Int. Cl.
*H03C 1/00*    (2006.01)
(52) U.S. Cl.
USPC ............................ 332/149; 327/356; 327/359

(58) Field of Classification Search
USPC .................... 332/149; 327/356, 359
See application file for complete search history.

(56) References Cited

U.S. PATENT DOCUMENTS

| 8,027,408 B2 * | 9/2011 | Nakamura ..................... 375/300 |
| 2008/0030336 A1 * | 2/2008 | Endo et al. ................. 340/572.1 |
| 2008/0180156 A1 * | 7/2008 | Yang et al. ..................... 327/359 |

* cited by examiner

*Primary Examiner* — Joseph Chang
*Assistant Examiner* — Jeffrey Shin
(74) *Attorney, Agent, or Firm* — Perkins Coie LLP; Aaron Wininger

(57) ABSTRACT

An ASK modulator includes a baseband unit which obtains a sequence comprising at least one amplitude value and adds an additional value to each of the at least one amplitude value to generate a modified sequence; a digital-to-analog converter coupled to the baseband unit, the digital-to-analog converter converts the modified sequence to generate a first signal, the additional value is determined based on a half scale of the digital-analog converter; and a mixer which receives the first signal and a second signal and generate a modulated signal by mixing the first signal with the second signal.

10 Claims, 8 Drawing Sheets

MODULATOR, MIXER AND METHOD FOR AMPLITUDE SHIFT KEYING MODULATION

CLAIM OF PRIORITY

This application claims priority to Chinese Application No. 201110445994.4 filed on Dec. 27, 2011, which is incorporated herein by reference.

TECHNICAL FIELD

The present application relates to amplitude shift keying modulation, and more particularly but not limited to a modulator, mixer and method for amplitude shift keying modulation.

BACKGROUND

Amplitude-shift keying (ASK) modulation is a form of modulation that represents digital data (binary one or zero) as variations in an amplitude of a carrier wave. One form of an ASK modulator operates as one single switch (on-off keying), using the presence of the carrier wave to indicate a binary one and its absence to indicate a binary zero. However, having a simple configuration, on-off keying presents no flexibility in terms of modulation depth.

Flexible modulation depths can be realized by distributing the carrier wave power control to multiple switches. The switches are driven by a clock signal and therefore introduce a clock component in an output spectrum. However, the clock component is very close to a central frequency so that the clock component can't be removed effectively, thereby causing inter-channel interference.

Mixers such as Gilbert mixers are not subject to such disadvantages but are still deficient due to nonlinearity.

Therefore, a new modulator, mixer and method for ASK modulation are required.

SUMMARY OF THE INVENTION

In an embodiment, an ASK modulator comprises a baseband unit configured to obtain a sequence comprising at least one amplitude value, and add an additional value to each of the at least one amplitude value to generate a modified sequence; a digital-to-analog converter coupled to the base band unit, configured to convert the modified sequence to generate a first signal, wherein the additional value is determined based on a half scale of the digital-to-analog converter; and a mixer configured to receive the first signal and a second signal and generate a modulated signal by mixing the first signal with the second signal.

In an embodiment, a method for ASK modulation comprises obtaining a sequence comprising at least one amplitude value by a base band unit; adding an additional value to each of the at least one amplitude value to generate a modified sequence by the baseband unit; converting the modified sequence by a digital-to-analog converter to generate a first signal, wherein the additional value is determined based on a half scale of the digital-to-analog converter; and mixing the first signal with a second signal by a mixer to generate a modulated signal.

In an embodiment, a Gilbert mixer comprises a first circuit configured to receive the first signal and generate a third signal by, at least in part, applying the first signal to a linear load, the first circuit comprises: a first operational amplifier and a second operational amplifier each having a first input configured to receive the first signal, a second input and an output; a linear load coupled between the second input of the first operational amplifier and the second input of the second operational amplifier; a first active element and a second active element each having a first, second and third terminals, wherein the first terminal of the first active element is coupled (e.g., direct current coupled) to the output of the first operational amplifier and the first terminal of the second active element is coupled to the output of the second operational amplifier, the second terminal of the first active element is coupled to the second input of the first operational amplifier and the second terminal of the second active element is coupled to the second input of the second operational amplifier, the third terminals of the first and second active elements are coupled to the second circuit to provide the third signal; a circuit coupled to the second input of each of the first and second operational amplifiers and configured to provide a DC operating point for each of the first and second active elements. a second circuit coupled to the first circuit, the second circuit is configured to receive the third signal and a second signal and generate a modulated signal by mixing the second signal with the third signal.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling description of these examples. Those skilled in the art will understand, however, that the invention may be practiced without many of these details. Additionally, some well-known structures or functions may not be shown or described in detail, so as to avoid unnecessarily obscuring the relevant description.

The terminology used in the description presented below is intended to be interpreted in its broadest reasonable manner, even though it is being used in conjunction with a detailed description of certain specific examples of the invention. Certain terms may even be emphasized below, however, any terminology intended to be interpreted in any restricted manner will be overtly and specifically defined as such in this Detailed Description section.

Figure 1:
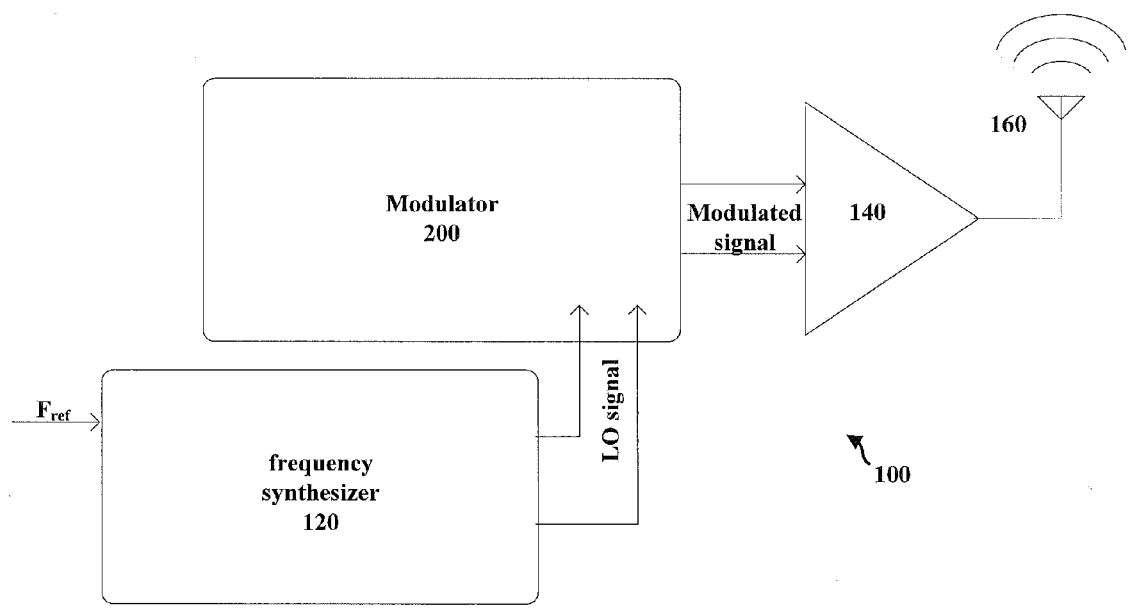
FIG. 1 is a block diagram illustrating a transmitter including an ASK modulator according to an embodiment of the invention.

FIG. 1 is a block diagram illustrating a transmitter 100 according to an embodiment of the invention. The transmitter 100 may be employed in an on-board unit (OBU) or a Road Side Unit (RSU) in an Electronic Toll Collection (ETC) system, a radio frequency identification device (RFID), a radio program broadcasting system, a radio transceiver or any other system based on ASK modulation.

The transmitter 100 includes a frequency synthesizer 120 fed by a reference signal. The frequency synthesizer 120 may comprise a phase locked loop (PLL) and is configured to generate a second signal, e.g., local oscillator (LO) signal. The LO signal may be a differential LO signal having a first component and a second component, the first and second components having a phase difference of 180°. A modulator 200 may be configured to receive and modulate the LO signal by a modulating signal, e.g., an intermediate frequency signal generated based on processing a base band sequence, and generate a modulated ASK signal (also referred to as modulated signal). The modulated signal may be sent to an antenna 140 directly, or, as shown in FIG. 1, amplified by a power amplifier 140 before transmission.

Figure 2:
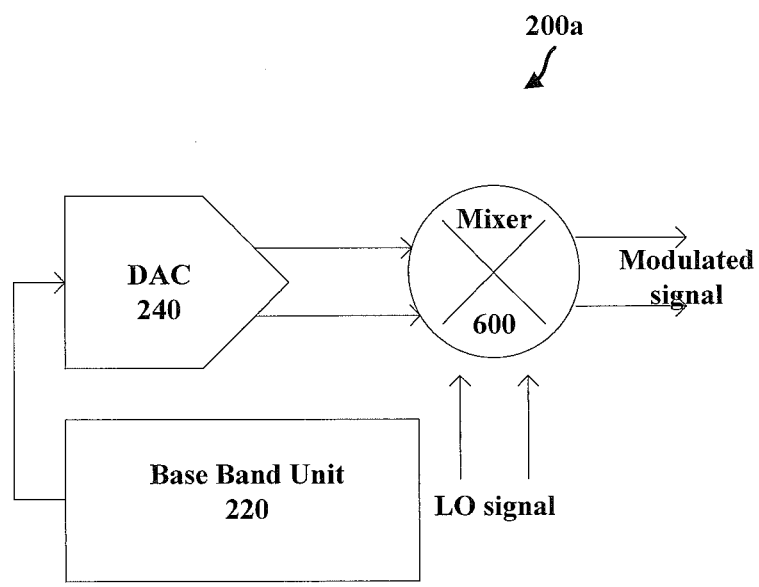
FIG. 2 is a block diagram illustrating the ASK modulator in FIG. 1 according to an embodiment of the invention.

FIG. 2 is a block diagram illustrating an ASK modulator 200a according to an embodiment of the invention. In this embodiment, the modulator 200a includes a baseband unit 220, a digital-to-analog converter (DAC) 240 and a mixer 600.

The baseband unit 220 may be configured to obtain a sequence (e.g., digital baseband signal) from a digital signal processor (DSP), a Field Programmable Gate Array (FPGA) or an analog-to-digital converter (ADC), etc. In an embodiment, the ASK modulator 200a may be employed in a transmitter for radio program broadcasting, an audio sensor collects and converts sound waves to an electronic analog signal which is then provided to the ADC. The ADC converts the analog audio signal to a sequence which is then provided to the baseband unit 220. In an embodiment, such a sequence may include amplitude values ranging from 0 to 60. The amplitude values are digital values denoting amplitudes and therefore are all non-negative integers.

Figure 5:
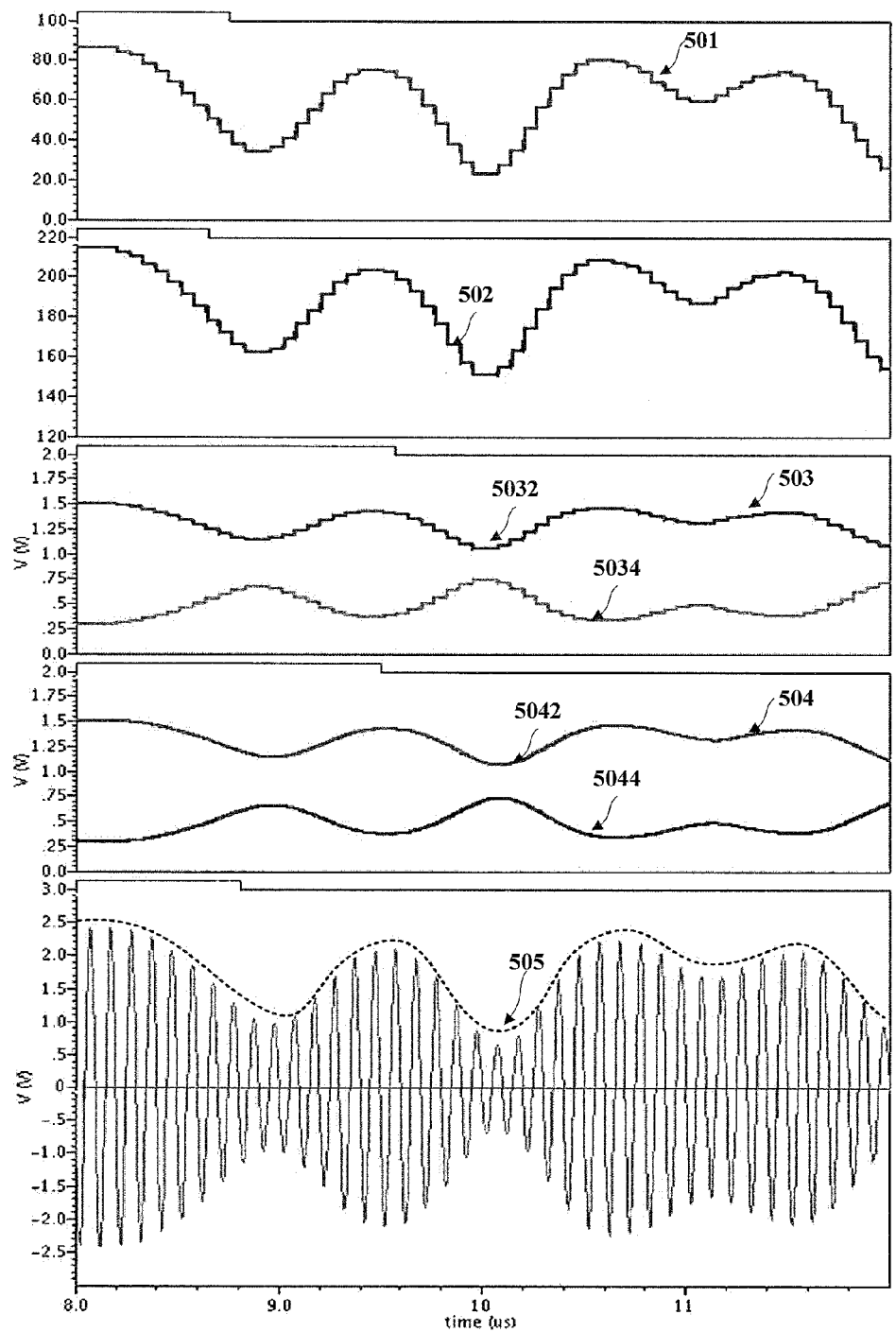
FIG. 5 is a drawing illustrating wave forms of signals in the ASK modulator $200b$ in FIG. 3.

The baseband unit 220 may obtain and process the sequence to generate and provide a modified sequence (e.g., an intermediate frequency signal) to the DAC 240, e.g., see waveforms of signals 501 (before modifying) and 502 (after modifying) in FIG. 5. As will be further described, by adding an additional value to the original (base and) sequence, a first (positive) component and a second (negative) component of the first (analog) signal (e.g., signal 503 in FIG. 5) output by the DAC 240 is shifted away from each other. It may thereby be ensured that a difference between the two components has no zero crossing points. If the difference has at least one zero crossing point, receivers receiving the modulated ASK signal may suffer an increased error rate which is even worse when modulation depth is relatively low. In an embodiment, the base band unit 220 performs no further operations besides the add operation.

The DAC 240 converts the modified sequence to a first signal, i.e., an analog signal which is typically a differential analog signal having a first component and a second component.

The mixer (multiplier) 600 may receive and mix the LO signal and the first signal to generate the modulated signal.

Figure 3:
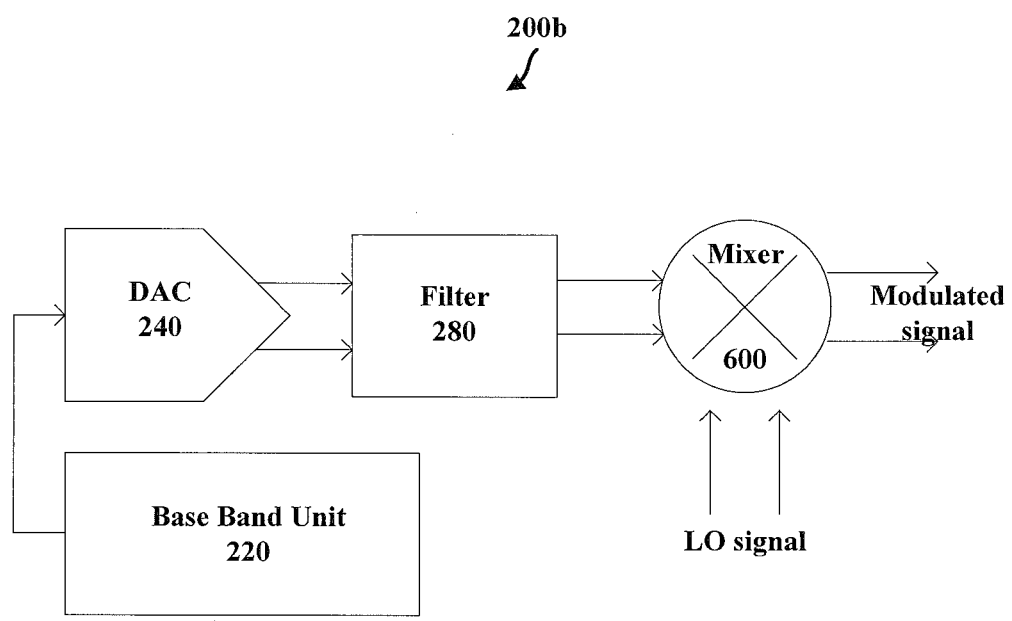
FIG. 3 is a drawing illustrating the ASK modulator in FIG. 1 according to another embodiment of the invention.

FIG. 3 is a drawing illustrating an ASK modulator 200b according to another embodiment of the invention. Comparing to the ASK modulator 200a in FIG. 2, the ASK modulator 200b further includes a filter 280 coupled between the DAC 240 and the mixer 600. Aspects and embodiments of the invention will be described primarily with reference to FIG. 3 hereinafter, however, the scope of the invention is not intended to be limited thereby. The filter 280 may be omitted, as shown in FIG. 2, when inter-channel interference is acceptable, e.g., in case the interfered channels are not in use or, the interfered channels have a lower priority comparing to the interfering one.

As the baseband sequence is driven by a clock signal, therefore an output spectrum of the DAC 240 may include a clock component which may cause inter-channel interference. In an embodiment, the filter 280 includes a low pass filter (LPF) to remove the clock component and/or other higher frequency component(s). For example, see wave forms of signals 503 (before filtering) and 504 (after filtering). It should be noted that any suitable filter or other signal processing device or any combination thereof may be used to provide a cleaner intermediate frequency (IF) signal to the mixer 600, such as high pass filter (HPF), band pass filter (BPF), etc.

The modulator 200b may have a flexible modulation depth to be compatible to different standards and/or operators. A modulation depth D may be determined by equation (1):

$$D = \frac{P_1 - P_0}{P_1 + P_0} \quad (1)$$

where $P_1$ is a transmission power for sending the digital "1" and $P_2$ is a transmission power for sending the digital "0".

Figure 4:
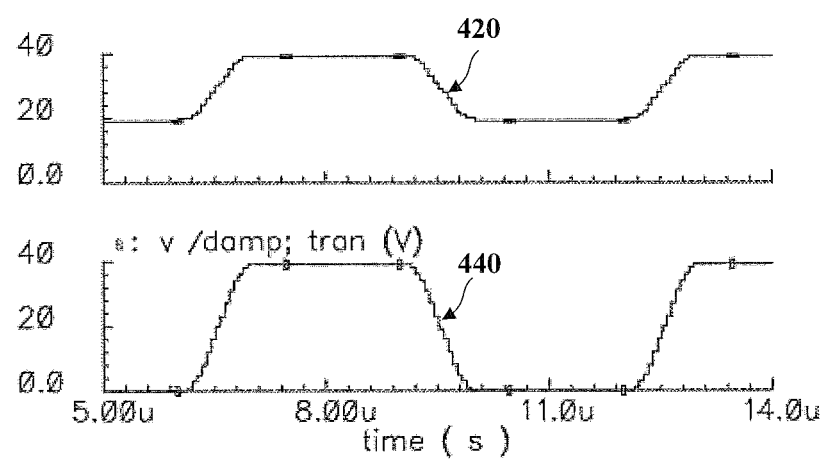
FIG. 4 is a drawing illustrating variable modulation depths provided by an ASK modulator according to an embodiment of the invention.

Referring to FIGS. 3 and 4, the baseband unit 220 provides an amplitude value at 40 to stand for a binary "1" and provides an amplitude value at 20 to stand for a binary "0", see curve 420. A relation between $P_1$ and $P_0$ is ideally the same as the relation between the amplitude values provided by the baseband unit 220. Therefore, D can be calculated as (40−20)/(40+20)=0.33 (33%).

In an embodiment, the modulator 200b may be required to change the modulation depth, e.g., to 100%. Hence, the base bandunit 220 provides an amplitude value 0 to stand for a binary "0", see curve 440. Therefore, the updated D can be calculated as (40−0)/(40+0)=1 (100%).

The modulator 200b may present any other suitable modulation depths from 0 to 100% by changing the amplitude value for binary "1" and/or "0". In an embodiment, the baseband unit 220b may carry out the modulation-depth change independently and hence there is no need to modify other components in the modulator 200b such as the DAC 240 and the mixer 600.

Referring to FIG. 3, for ASK modulations, it may be important for an envelope of the modulated ASK signal to comply with the baseband sequence for a reasonable error rate (e.g., bit error rate (BER)). Otherwise, a receiver may not recover the baseband sequence correctly from a received modulated ASK signal. In some embodiments, this conformity may be represented by linearity of the modulator 200b. That is, the envelope of the modulated ASK signal complies with the baseband sequence better when the modulator 200b presents a higher linearity, the envelope of the modulated ASK signal complies with the baseband signal worse when the modulator 200b presents a bad linearity. The linearity of the modulator 200b may be dependent on two factors, the mixing at the mixer 600, the digital-to-analog conversion at the DAC 240. Reference will be made respectively below.

FIG. 5 is a drawing illustrating waveforms of signals in the ASK modulator 200b in FIG. 3. A first (analog) signal 503 output by the DAC 240 may include a first component (also referred to as a positive component) 5032 and a second component (also referred to as a negative component) 5034 with a phase difference which is about 180°. In an embodiment, the first component 5032 is defined by expression (2) while the second component 5034 is defined by expression (3):

$$V_{dc}+\alpha A_{(t)} \qquad (2)$$

$$V_{dc}-\alpha A_{(t)} \qquad (3)$$

where $V_{dc}$ is a value taken by the first or second component when the baseband sequence is providing an amplitude value $2^{(n-1)}$, n is a width of the DAC 240. For example, an 8-bit DAC 240 (n=8) has a width of 8 and a scale of $2^8=256$. Therefore, when an amplitude value in baseband sequence changes by 1, the first and second components 5032 and 5034 each changes by 1/256.

In an embodiment, the baseband sequence ranges from about 0 to about 60, the first component of the first signal ranges from about 0 to about 60/256, and the second component of the first signal ranges from about 1 to about 196/256 (1−0~1−60/256).

As described above, it is important for the DAC 240 to not introduce nonlinearity. Thus it is intended that a product of multiplying a difference between the first and second components 5032 and 5034 by a constant is substantially equal to the baseband sequence.

Referring to FIG. 5 and examining the exemplary case above, a difference between the first and second components 5032 and 5034 ranges from about −1 to about −136/256. It is clear that a product of multiplying −1 to −136/256 by any constant won't be equal to 0 to 60. This "non-linearity" will be reflected in a modulated signal generated by the mixer 600 and cause an increased error rate at a receiver receiving the modulated signal, and/or demand a higher end receiver to have a reasonable error rate.

In some embodiments of the invention, an additional value determined based on a half scale of the DAC 240 is added to the baseband sequence, i.e., to each amplitude value in the baseband sequence. The additional value may be substantially equal to the half scale, i.e., about $2^{8-1}=2^7=128$.

Referring back to the exemplary case above, by adding 128 to the base band sequence, a modified digital base band sequence including values ranging from about 128 (i.e., 0+128) to about 188 (i.e., 60+128) is generated. Accordingly, the first component ranges from about 128/256 and the second component ranges from about 128/256 (i.e., 1−128/256) to about 68/256 (i.e., 1−188/256). A difference between the first and second components ranges from about 0 (i.e., 128/256−128/256) to about 120/256 (188/256−68/256). Note that 0 to 120/256×256/2=0 to 60, the first signal generated based on the modified sequence presents higher fidelity and therefore make it easier for a receiver to demodulate and decode correctly.

In some embodiments, the additional value is adjustable so the baseband unit 220 can be compatible with DACs with different half scales. In an embodiment, the baseband unit 220 may be configured to automatically detect a width of a DAC to which the baseband unit 220 is coupled to. For example, the DAC may be configured to generate an indicator indicating that a received amplitude value is within a scale of the DAC. The baseband unit 220 may be configured to send a sequence of test values to the DAC and receive the indicators. If a first value is within the scale and a second value is out of the scale, then it can be determined that the scale (which is typically equal to $2^N$) is between the first value and a second value. In an embodiment, the first value is 225 and the second value is 300, thus the scale can be determined as 256 and the width of the DAC is 8.

Alternatively, the baseband unit 220 may be configured to receive an indicator from a central processor on the receiver. The baseband unit 220 can also be bound to a specific value.

As discussed above, the additional value added to the sequence is determined such that the difference between the differential components of the first signal 503 generated by the DAC 240 can be transformed to the baseband sequence by a constant. In some embodiments, the additional value is determined such that the difference between the differential components is always negative or non-negative, i.e., a curve showing the difference does not have a zero crossing points. If the curve has one or more zero crossing point, an envelope of a modulated signal generated by the mixer 600 will deform at the zero crossing point(s) and cause a higher error rate at a receiver.

It should be noted that it is not intended to limit the invention to those embodiments in which the additional value is equal to the half scale of the DAC 240. The additional value can be approximately equal to the half scale of the DAC 240, e.g., 130, 125, 133, etc. In an embodiment, the additional value is equal to the half scale for voice communications and may be not exactly equal to the half scale for data communications.

Figure 6:
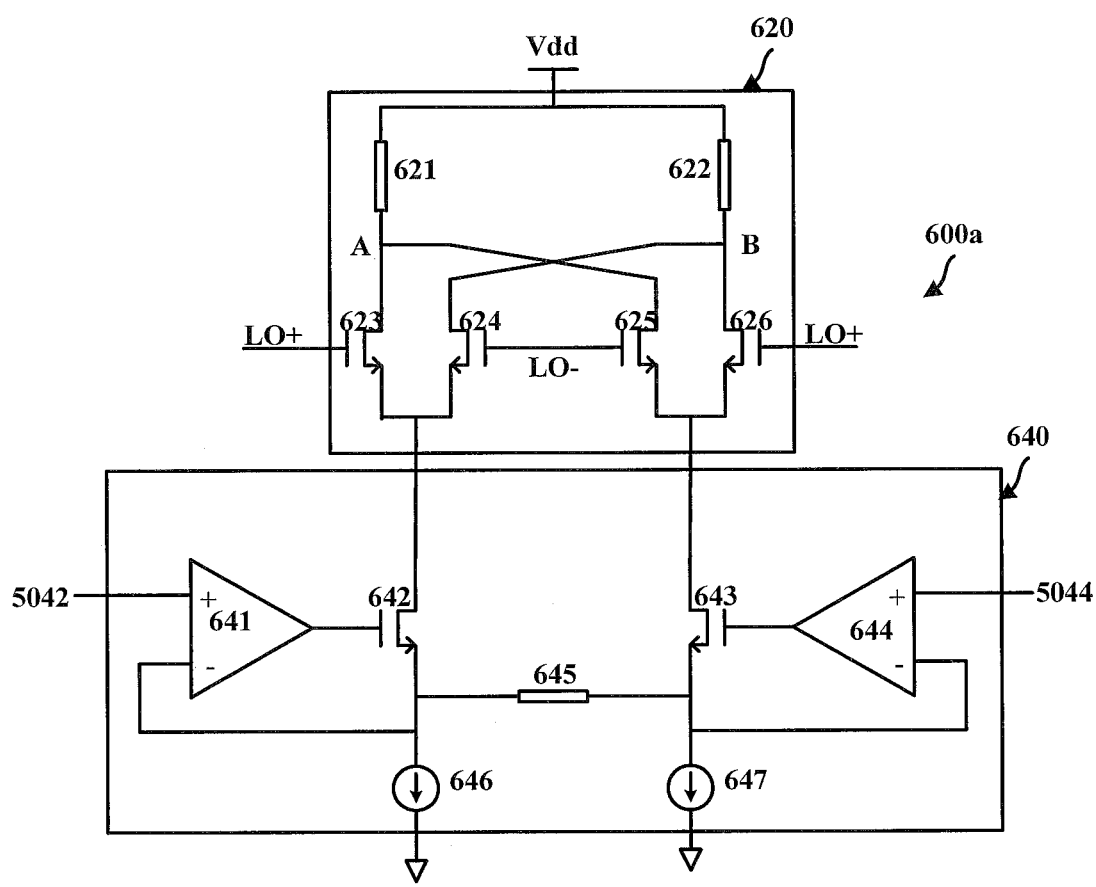
FIG. 6 is a drawing illustrating a Gilbert mixer according to an embodiment of the invention.

Linearity at the mixer 600 will be described with reference to FIGS. 3, 5-7. FIG. 6 is a drawing illustrating a mixer 600a according to an embodiment of the invention. The mixer 600a includes a first circuit 640 and a second circuit 620. The first circuit 640 is configured to receive the first signal 530 (e.g., two components 5302 and 5304), generate and provide a third signal, e.g., a current signal, to the second circuit 620 based on the received first signal 530, e.g., a voltage signal. The first circuit 640 may therefore be considered as a circuit which converts the first signal 530 to a third signal linearly. The second circuit 620 is a circuit which receives and mixes the third signal and a second signal. The second signal may be a LO signal generated by the frequency synthesizer 120 in FIG. 1 and include a first (positive) component LO+ and a second (negative) component LO−.

Specifically, the first circuit 640 may include a first operational amplifier 641, a second operational amplifier 644, each having a first input configured to receive the first signal, a second input and an output. In this embodiment, the first input of the first amplifier 641 receives the first component 5302 of the first signal 530, the first input of the amplifier 644 receives the second component 5304 of the first signal 530.

The first circuit 640 further includes a linear load 645, which is a resistor in this embodiment. In different embodiments, any suitable linear load or any combination thereof may be used instead. The resistor 645 follows Ohm's law and has a lower temperature coefficient compared to other devices.

As illustrated in FIG. 6, the resistor 645 is connected between the second input of the first and second operational amplifier 641 and 644. As a principle of operational amplifiers, the first component 5032 is carried (transported) to the second input of the first operational amplifier 641, the second component 5034 is carried (transported) to the second input of the second operational amplifier 644. Therefore, a voltage presented by the first signal 530 is applied to the resistor 645 and an alternating current is generated in the resistor 645 and defined by expression (4):

$$I=V_{in}/R \qquad (4)$$

wherein $V_{in}$ is a voltage presented by the first signal 530. Therefore, the first signal 530 is linearly converted to the alternating current I. As the first signal 530 is from the DAC 240 or the filter 280 which lacks sufficient drive capability for the resistor 645, the operational amplifiers 641 and 644 are used to drive the resistor 645 effectively. In some embodiments, other active devices may be used to instead of the operational amplifiers to drive the resistor 645.

The first circuit 640 further includes a first active element 642 and a second active element 643 which are both MOSFETs in this embodiment. In an alternative embodiment, the two active elements may be bipolar transistors. Each of the MOSFETs 642 and 643 has a first terminal (i.e., gate), a second terminal (i.e., source) and a third terminal (i.e., drain). The gate of MOSFET 642 is coupled to the output of the first operational amplifier 641 and the MOSFET 642 is set to a saturation zone thereby. The gate of MOSFET 643 is coupled to the output of the second operational amplifier 644 and the MOSFET 643 is set to a saturation zone thereby. Furthermore, the source of the MOSFET 642 is coupled to the second input of the amplifier 641 and an end of the resistor 645, the source of the MOSFET 643 is coupled to the second input of the amplifier 644 and the other end of the resistor 645. The drains of both MOSFET 642 and 643 are configured to provide the third signal to the second circuit 620. Specifically, the drain of MOSFET 642 provides a first (positive) component, e.g., an alternating drain-source current in the MOSFET 642, of the third signal, the drain of MOSFET 643 provides a second (negative) component, e.g., an alternative drain-source current in the MOSFET 643, of the third signal. In case the first circuit 640 uses bipolar transistors instead of the MOSFETs, a base of a transistor may be coupled as a gate of a MOSFET, an emitter of a transistor may be coupled as a source of a MOSFET, and a collector of a transistor may be coupled as a drain of a MOSFET. As illustrated, the MOSFETs 642 and 643 each forms a source follower.

In this embodiment, the first circuit 640 further includes two current sources 646 and 647. The current source 646 may provide a DC operating point for the MOSFET 642 and the current source 647 may provide a DC operating point for the MOSFET 643. Specifically, a current in the current source 646 is consistent, therefore any change (alternating) of the current flowing in the MOSFET 642 flows in the resistor 645. That is, an alternating current in the MOSFET 642 is equal to the current in the resistor 645 and denoted as $V_{in}/R$. Similarly, an alternating current in the MOSFET 643 is equal to the current in the resistor 645 and denoted as $-V_{in}/R$.

As illustrated, the second circuit 620 may include MOSFETs 623 and 624 forming a first pair, MOSFETs 625 and 626 forming a second pair. MOSFETs 623 and 626 receive a first (positive) component (LO+) of the LO signal at their respective gate. MOSFETs 624 and 625 receive a second (negative) component (LO−) of the LO signal at their respective gate coupled to each other. Sources of the MOSFETs 623 and 624 are coupled to each other and configured to receive the first component of the third signal from the drain of the MOSFET 642, sources of MOSFETs 625 and 626 are coupled to each other and configured to receive the second component of the third signal from the drain of the MOSFET 643. Drains of the MOSFETs 623 and 625 are couple to each other and form an output (A) of the mixer 600a and drains of the MOSFETs 624 and 626 are coupled to each other and form the other output (B) of the mixer 600a. The outputs A and B of the mixer 600a are configured to provide a modulated signal which is typically a differential signal (a first component at output A and a second component at output B). A load 621 is coupled between operation power source ($V_{dd}$) and the output A, another load 622 is coupled between the operation power source and the output B so as to provide DC operating points to MOSFETs 623-626.

As discussed above, the second circuit 620 receives the third signal and the LO signal and then mix the same. Specifically, in an embodiment, the first signal 503 is $V_{in}$, $LO^+ = k \cdot \cos(\omega_{LO}t)$, $LO^- = -k \cdot \cos(\omega_{LO}t)$, where k is a constant representing an amplitude of the LO signal, an AC current in the MOSFET 642 is $V_{in}/R$ and an AC current in the MOSFET 643 is $-V_{in}/R$.

Therefore, the modulated signal at output A can be defined by expression (5) and the modulated signal at output B can be defined by expression (6):

$$(V_{in}/R) \cdot [k \cdot \cos(\omega_{LO}t)] + (-V_{in}/R) \cdot [-k \cdot \cos(\omega_{LO}t)] = 2(V_{in}/R) \cdot [k \cdot \cos(\omega_{LO}t)] \quad (5)$$

$$V_{in}/R) \cdot [-k \cdot \cos(\omega_{LO}t)] + (-V_{in}/R) \cdot [k \cdot \cos(\omega_{LO}t)] = -2(V_{in}/R) \cdot [k \cdot \cos(\omega_{LO}t)] \quad (6).$$

By subtracting expression (6) from expression (5), it can be seen that the modulated ASK signal is defined by expression (7):

$$4(V_{in}/R) \cdot [k \cdot \cos(\omega_{LO}t)] \quad (7).$$

examining the expression (7), it is clear that a frequency of the modulated signal is $\omega_{LO}$, and an amplitude thereof is $4k(V_{in}/R)$, therefore an envelop of the modulated ASK signal is determined by $V_{in}$. See FIG. 5, the shape of the dotted line at the bottom complies with the baseband sequence 501, which is important for ASK demodulation. That is, the baseband sequence 501 is reflected by the envelope of the modulated signal with a high fidelity which helps a receiver in recovering the original signal.

Operational amplifiers are used in the mixer 600a, however, the mixer 600a is still a low power consumption device because the operational amplifiers are both configured to process an IF signal having a frequency which is much lower than radio frequency. Furthermore, in many embodiments, the modulator 200 is not required to operate all the time. Take an on board unit (OBU) for example, a wake-up circuit associated with the modulator 200 may be provided and the modulator 200 does not operate until the wake-up circuit wakes it up. Considering the power consumption caused by the operational amplifiers, the modulator 200 may be used for modulating signals with lower frequencies.

As illustrated in FIG. 6, there are 3 levels of MOSFETs (including one level of MOSFETs in the current sources) coupled between $V_{dd}$ and ground. In submicron or deep submicron applications, $V_{dd}$ can be about 1.8V, about 1.2V or even below about 1V. Thus a voltage headroom of signals may be limited by this overlying configuration.

Figure 7:
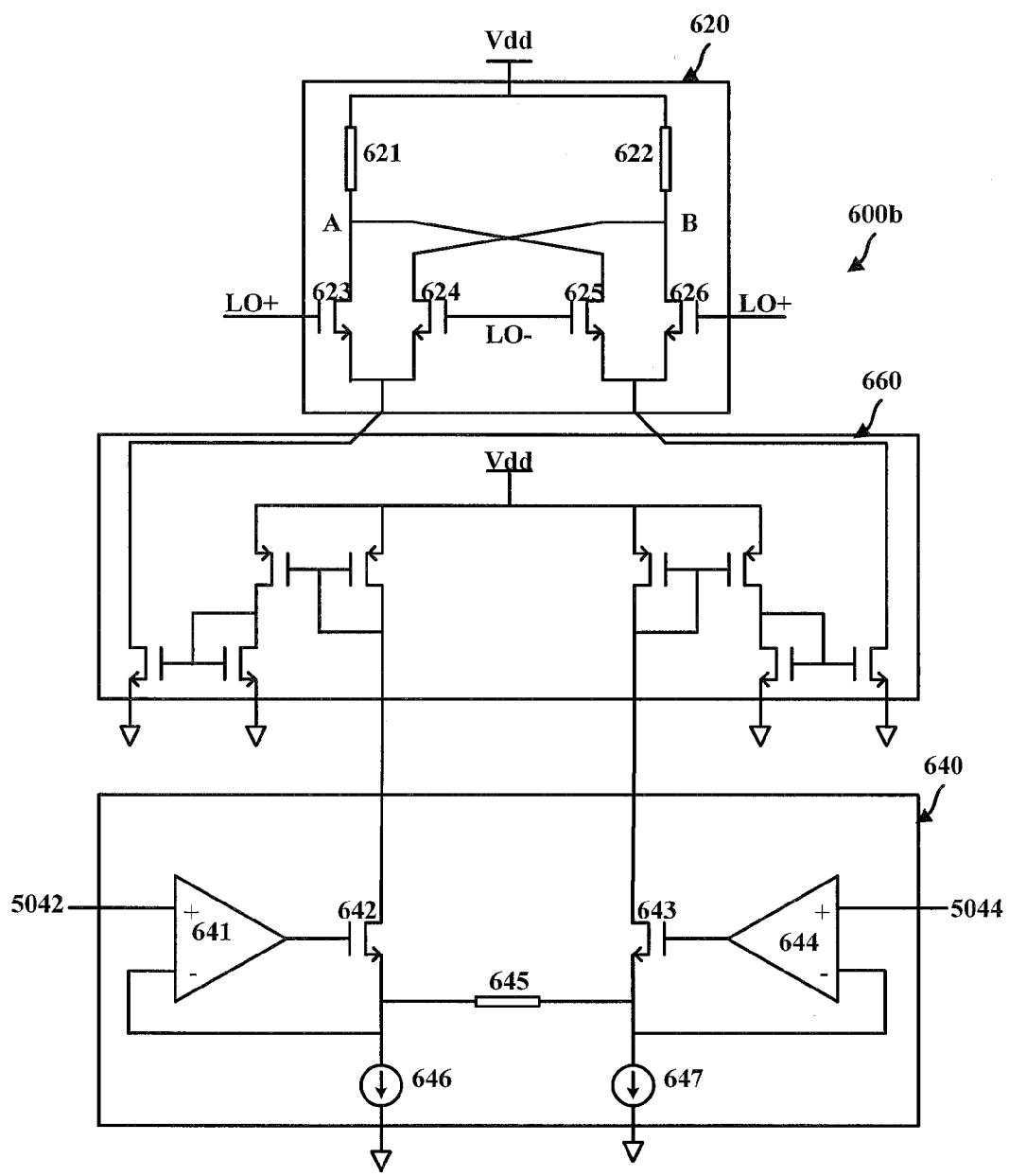
FIG. 7 is a drawing illustrating a Gilbert mixer according to another embodiment of the invention.

FIG. 7 is a drawing illustrating a Gilbert mixer 600b according to another embodiment of the invention. In the mixer 600b, a current mirror 660 is coupled between the first circuit 640 and the second circuit 620 and configured to linearly scale a current signal to provide enough voltage headroom in the mixer 600b.

Figure 8:
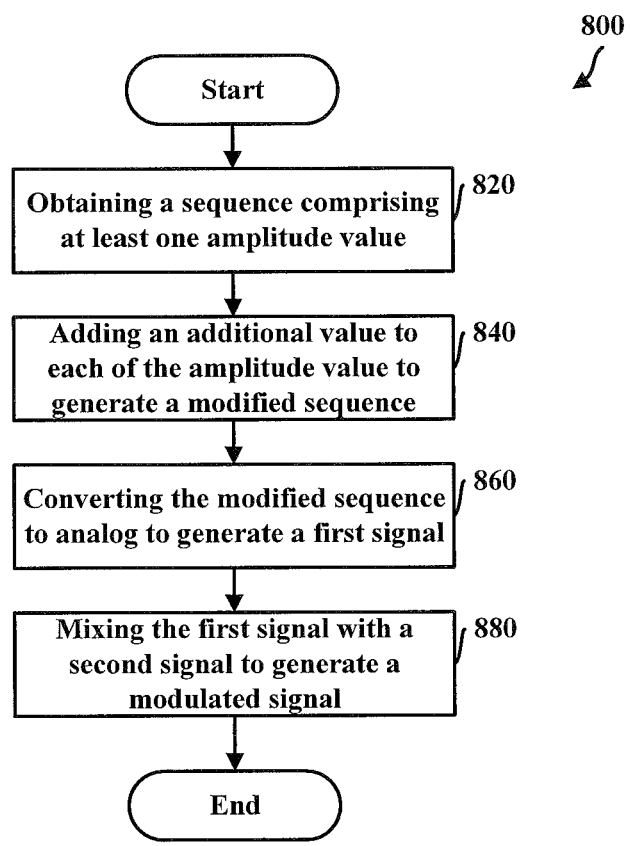
FIG. 8 is a flow chart of a method for ASK modulation according to an embodiment of the invention.

FIG. 8 is a flow chart of a method 800 for ASK modulation according to an embodiment of the invention. The method 800 is typically carried out by an ASK modulator, e.g., the modulator 200b in FIG. 3. Reference will be made below referring to FIGS. 3, 5 and 8.

The method 800 starts at block 820. At block 820, the modulator 200 obtains a baseband sequence, e.g., baseband sequence 501.

At block 840, the modulator 200 adds an additional value to each amplitude value in the baseband sequence 501 to generate a modified baseband sequence 502. The additional value is determined based on a half scale of the DAC 240, and is approximately equal to the half scale of the DAC 240 in this embodiment.

The modified baseband sequence 502 is then provided to the DAC 240 and converted to an analog signal 503 which is a differential signal comprising a first component 5032 and a second component 5034. In an embodiment, by adding the additional value to the baseband sequence, the components 5032 and 5034 are moved away from each other and hence a difference thereof has no zero crossing point.

In an embodiment, at block 880 the generated first signal 503 is mixed directly with a second signal, e.g., a LO signal, so as to generate a modulated ASK signal. Alternatively, before the mixing, the first signal 503 is filtered by a filter 280 to generate a filtered first signal which is then mixed with the second signal, thereby the modulated ASK signal 505 in FIG. 5 is generated.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An ASK modulator, comprising:
a baseband unit configured to obtain a sequence comprising at least one amplitude value, and add an additional value to each of the at least one amplitude value to generate a modified sequence, wherein the additional value is determined based on a half scale of a digital-to-analog converter; and
the digital-to-analog converter which is coupled to the baseband unit, and configured to convert the modified sequence to generate a first signal; and
a mixer configured to receive the first signal and a second signal and generate a modulated signal by mixing the first signal with the second signal;
wherein the baseband unit is further configured to provide at least one test value to the digital-to-analog converter;
the digital-to-analog converter is further configured to receive the at least one test value and generate an indicator indicating if the at least one test value is within the scale of the digital-to-analog converter;
the baseband unit is further configured to receive the indicator and determine the scale of the digital-to-analog converter and
determining the additional value based on the half scale of the digital-to-analog converter.

2. The ASK modulator of claim 1, wherein the additional value is approximately equal to the half scale of the digital-analog converter.

3. The ASK modulator of claim 1, wherein the mixer comprises:
a first circuit configured to receive the first signal and generate a third signal by, at least in part, applying the first signal to a linear load; and
a second circuit coupled to the first circuit, the second circuit is configured to receive the second and third signals and generate the modulated signal by mixing the second signal with the third signal.

4. The ASK modulator of claim 3, wherein the first circuit comprises:
a first operational amplifier and a second operational amplifier each having a first input configured to receive the first signal, a second input and an output, wherein the linear load is coupled between the second input of the first operational amplifier and the second input of the second operational amplifier;
a first active element and a second active element each having a first, second and third terminals, wherein the first terminal of the first active element is coupled to the output of the first operational amplifier and the first terminal of the second active element is coupled to the output of the second operational amplifier, the second terminal of the first active element is coupled to the second input of the first operational amplifier and the second terminal of the second active element is coupled to the second input of the second operational amplifier, the third terminals of the first and second active elements are coupled to the second circuit to provide the third signal;
a circuit coupled to the second input of each of the first and second operational amplifiers and configured to provide a DC operating point for each of the first and second active elements.

5. The ASK modulator of claim 4, wherein the first signal includes a differential signal having a first component and a second component, the first input of the first operational amplifier is configured to receive the first component of the first signal and the first input of the second operational amplifier is configured to receive the second component of the first signal.

6. The ASK modulator of claim 3, wherein the mixer comprises a Gilbert mixer.

7. The ASK modulator of claim 4, wherein each of the first and second active elements comprises a MOSFET, the first terminal of each of the first and second active elements comprises a gate, the second terminal of each of the first and second active elements comprises a source, the third terminal of each of the first and second active elements comprises a drain, or
each of the first and second active elements comprises a transistor, the first terminal of each of the first and second active elements comprises a base, the second terminal of each of the first and second active elements comprises an emitter, the third terminal of each of the first and second active elements comprises a collector.

8. A method for ASK modulation, comprising:
obtaining a sequence comprising at least one amplitude value by a baseband unit; adding an additional value to each of the at least one amplitude value to generate a modified sequence by the baseband unit;
converting the modified sequence by a digital-to-analog converter to generate a first signal, wherein the additional value is determined based on a half scale of the digital-to-analog converter; and
mixing the first signal with a second signal by a mixer to generate a modulated signal; and the method further comprises:
providing at least one test value by the base band unit to the digital-to-analog converter;
receiving the at least one test value and generating, by the digital-to-analog converter, an indicator indicating if the at least one test value is within the scale of the digital-to-analog converter;
receiving the indicator and determining, by the baseband unit, the scale of the digital-to-analog converter and
determining, by the baseband unit, the additional value based on the half scale of the digital-to-analog converter.

9. The method of claim 8, further comprising:
filtering the first signal to generate a filtered first signal;

the mixing further comprises:
mixing the filtered first signal with the second signal by the mixer to generate the modulated signal.

10. The method of claim 8, wherein the additional value is approximately equal to the half scale of the digital-analog converter.

* * * * *